United States Patent
Kurihara

(10) Patent No.: US 10,103,355 B2
(45) Date of Patent: Oct. 16, 2018

(54) LIGHT EMITTING DEVICE AND METHOD FOR MANUFACTURING THE SAME

(71) Applicant: Semiconductor Energy Laboratory Co., Ltd., Kanagawa-ken (JP)

(72) Inventor: Tomoyuki Kurihara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/432,309

(22) Filed: Feb. 14, 2017

(65) Prior Publication Data

US 2017/0155091 A1    Jun. 1, 2017

Related U.S. Application Data

(60) Continuation of application No. 13/707,925, filed on Dec. 7, 2012, now Pat. No. 9,577,218, which is a
(Continued)

(30) Foreign Application Priority Data

Dec. 26, 2002    (JP) .................................. 2002-378668

(51) Int. Cl.
  *H01L 51/52* (2006.01)
  *H01L 27/32* (2006.01)
  *H01L 51/56* (2006.01)

(52) U.S. Cl.
  CPC ...... *H01L 51/5259* (2013.01); *H01L 27/3262* (2013.01); *H01L 51/5246* (2013.01); *H01L 51/5256* (2013.01); *H01L 51/56* (2013.01)

(58) Field of Classification Search
  CPC .................................................. H01L 51/5246
  (Continued)

(56) References Cited

U.S. PATENT DOCUMENTS 5,962,962 A    10/1999  Fujita et al.
6,222,603 B1    4/2001  Sakai et al.
(Continued)

FOREIGN PATENT DOCUMENTS

EP    1 361 556 A1    11/2003
JP    64-054420 A    3/1989
(Continued)

OTHER PUBLICATIONS

International Search Report re Application No. PCT/JP2003/16539, dated Feb. 10, 2004.
(Continued)

*Primary Examiner* — Christopher Raabe
(74) *Attorney, Agent, or Firm* — Husch Blackwell LLP

(57) ABSTRACT

When attaching a substrate with an EL element formed thereon and a transparent sealing substrate, the periphery of a pixel portion is surrounded with a first sealing agent that maintains a gap between the two pieces of substrates, an entire surface of the pixel portion is covered with a second transparent sealing agent so that the two pieces of substrate is fixed with the first sealing agent and the second sealing agent. Consequently, the EL element can be encapsulated by curing the first sealing agent and the second sealing agent without enclosing a drying agent and doing damage to the EL element due to UV irradiation even when a sealing device only having a function of UV irradiation is used.

24 Claims, 9 Drawing Sheets

Related U.S. Application Data continuation of application No. 13/122,238, filed on May 20, 2011, now Pat. No. 8,330,363, which is a continuation of application No. 11/516,135, filed on Sep. 6, 2006, now Pat. No. 7,948,175, which is a division of application No. 10/744,296, filed on Dec. 22, 2003, now Pat. No. 7,109,655.

(58) Field of Classification Search
USPC .......................................................... 257/40
See application file for complete search history.

(56) References Cited

U.S. PATENT DOCUMENTS

| | | | |
|---|---|---|---|
| 6,396,208 | B1 | 5/2002 | Oda et al. |
| 6,612,888 | B1 | 9/2003 | Pai et al. |
| 6,617,052 | B2 | 9/2003 | Morii |
| 6,717,052 | B2 | 4/2004 | Wang et al. |
| 6,747,402 | B2 | 6/2004 | Hato et al. |
| 6,791,660 | B1 | 9/2004 | Hayashi et al. |
| 6,890,782 | B2 | 5/2005 | Yamada |
| 7,109,655 | B2 | 9/2006 | Kurihara |
| 7,169,636 | B2 | 1/2007 | Maruyama et al. |
| 7,700,958 | B2 | 4/2010 | Nishi et al. |
| 7,948,175 | B2 | 5/2011 | Kurihara |
| 9,577,218 | B2 * | 2/2017 | Kurihara ............... H05B 33/04 |
| 2001/0044035 | A1 | 11/2001 | Morii |
| 2001/0048234 | A1 | 12/2001 | Liu et al. |
| 2002/0140643 | A1 | 10/2002 | Sato |
| 2002/0176992 | A1 | 11/2002 | Parthasarathy et al. |
| 2003/0006003 | A1 * | 1/2003 | Matsuoka ............. G02F 1/1339 |
| | | | 156/272.2 |
| 2003/0006697 | A1 | 1/2003 | Weaver |
| 2003/0006698 | A1 | 1/2003 | Mayuzumi |
| 2003/0107042 | A1 | 6/2003 | Chang et al. |
| 2003/0122476 | A1 | 7/2003 | Wang et al. |
| 2003/0218422 | A1 * | 11/2003 | Park ........................ H01L 51/56 |
| | | | 313/512 |
| 2004/0004434 | A1 | 1/2004 | Nishi et al. |
| 2007/0120132 | A1 | 5/2007 | Maruyama et al. |
| 2010/0173555 | A1 | 7/2010 | Nishi et al. |

FOREIGN PATENT DOCUMENTS

| | | |
|---|---|---|
| JP | 05-005890 A | 1/1993 |
| JP | 11-185956 A | 7/1999 |
| JP | 2000-068050 A | 3/2000 |
| JP | 2001-338755 A | 12/2001 |
| JP | 2001-345175 A | 12/2001 |
| JP | 2002-025764 A | 1/2002 |
| JP | 2002-216950 A | 8/2002 |
| JP | 2002-352951 A | 12/2002 |
| JP | 2003-243161 A | 8/2003 |
| JP | 2004-039542 A | 2/2004 |
| TW | 401631 B | 8/2000 |
| TW | 452952 B | 9/2001 |
| TW | 502552 B | 9/2002 |
| TW | 511304 B | 11/2002 |
| TW | 515062 B | 12/2002 |
| WO | WO 2001/091520 A1 | 11/2001 |

OTHER PUBLICATIONS

International Preliminary Examination Report re Application No. PCT/JP03/16539;PCT6848, dated Mar. 9, 2004.
Office Action re Taiwanese Application No. TW 92136440, dated Feb. 22, 2010.

* cited by examiner

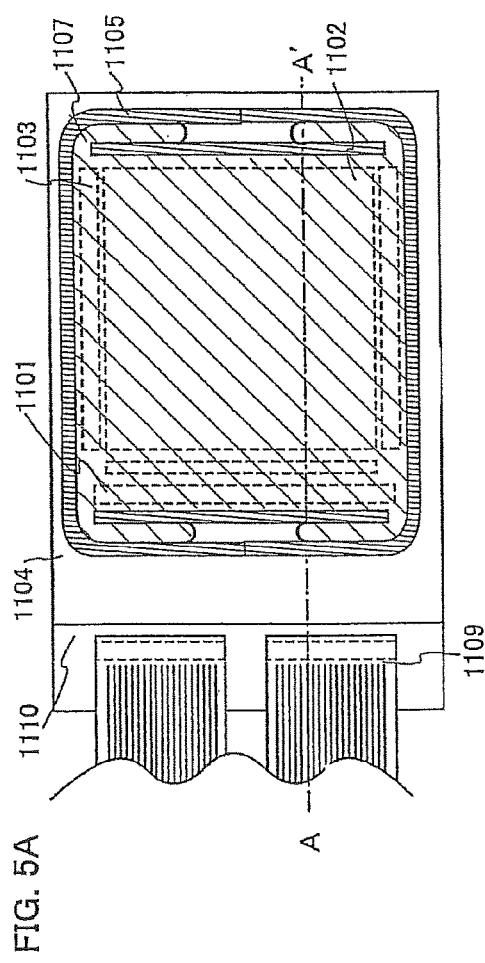
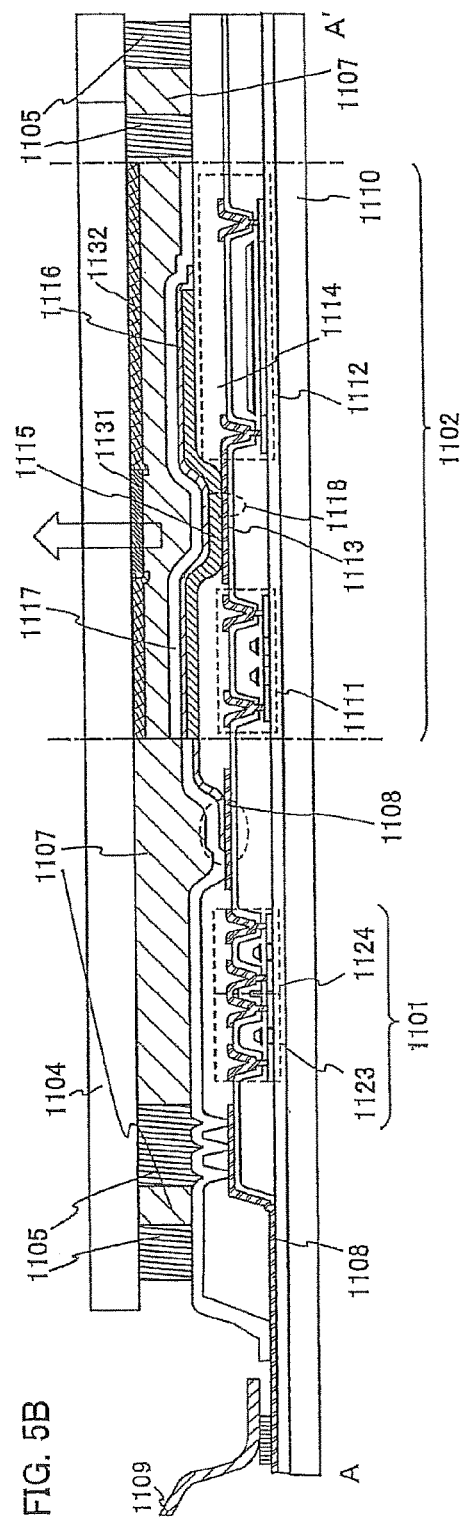
FIG. 5A
FIG. 5B

LIGHT EMITTING DEVICE AND METHOD FOR MANUFACTURING THE SAME

This application is a continuation of U.S. application Ser. No. 13/707,925, filed on Dec. 7, 2012 which is a continuation of U.S. application Ser. No. 13/112,238, filed on May 20, 2011 (now U.S. Pat. No. 8,330,363 issued Dec. 11, 2012) which is a continuation of U.S. application Ser. No. 11/516,135, filed on Sep. 6, 2006 (now U.S. Pat. No. 7,948,175 issued May 24, 2011) which is a divisional of U.S. application Ser. No. 10/744,296, filed on Dec. 22, 2003 (now U.S. Pat. No. 7,109,655 issued Sep. 19, 2006) which are all incorporated herein by reference.

TECHNICAL FIELD

The present invention relates to a light emitting device having a light emitting layer which includes an organic compound, and a method for manufacturing the same. The present invention further relates to an electronic appliance mounted with the light emitting device as a component. The light emitting device described in the present specification indicates, for example, an EL display device.

BACKGROUND OF THE INVENTION

In recent years, research related to a light emitting device having an EL element as a self-luminous element has been actively carried out. Particularly, a light emitting device using an organic material as an EL material has been attracting attention. The light emitting device is also referred to as an EL display device. The EL element includes a layer containing an organic compound, which generates luminescence (electroluminescence) by being applied with an electric field (hereinafter, referred to as an EL layer); an anode; and a cathode. The luminescence generated in the layer containing the organic compound includes luminescence (fluorescence) that is generated upon returning of electrons to a ground state from excited singlet state and luminescence (phosphorescence) that is generated upon returning of electrons to a ground state from excited triplet state.

The EL element has a structure in which an EL layer is sandwiched between a pair of electrodes. The EL layer generally has a lamination structure. Typically, a lamination structure of "a hole transporting layer, a light emitting layer, and an electron transporting layer" is cited. The structure provides greatly high light-emitting efficiency and has been used in almost all light emitting devices that have been researched and developed now.

Alternatively, a structure composed by sequentially laminating a hole injecting layer, a hole transporting layer, a light emitting layer, and an electron transporting layer on an anode or a structure composed by sequentially laminating a hole injecting layer, a hole transporting layer, a light emitting layer, an electron transporting layer, and an electron injecting layer is also applicable. Fluorescent pigments and the like may be doped to the light emitting layer.

Either a low molecular weight material or a high molecular weight material can be used for forming these layers.

In addition, the EL layer is a generic term used to refer to all layers formed between a cathode and an anode. Therefore, all of each the above-mentioned hole injecting layer, hole transporting layer, light emitting layer, electron transporting layer, and electron injecting layer are included in the EL layer.

Further, a light emitting element composed of a cathode, an EL layer, and an anode is referred to as an EL element.

There are two kinds for forming the EL element as follows: a system for forming an EL layer between two kinds of striped electrodes that run at right angles to one another (passive matrix system); and another system for forming an EL layer between a pixel electrode and a counter electrode arranged in matrix that are connected to a TFT (active matrix system). When the pixel density is increased, it has been considered that the active matrix system has an advantage over the simple matrix system since the active matrix can be driven at lower voltage for having switches in each pixel (or each dot).

Since the EL element is extremely and easily deteriorated by being oxidized or absorbing moisture due to existence of oxygen or moisture, there has been a problem that the light-emitting efficiency of the EL element is decreased or the lifetime thereof is shortened. Therefore, moisture and oxygen has been conventionally prevented from penetrating into the EL element as follows: the EL element is covered with an opposing substrate, dry air is filled thereinto, and a drying agent is further attached thereto. A substrate with the EL element formed thereon and the opposing substrate are adhered to each other with a sealing agent (for example, see Patent Document 1).

A step for adhering the substrate with the EL element formed thereon and the opposing substrate with the sealing agent is referred to as a sealing or a sealing step.

Further, since an EL material is damaged by UV irradiation, there has been a problem in which the light-emitting efficiency of a light emitting element is reduced and lifetime thereof is shortened.

The EL element has conventionally included a structure in which an electrode is formed as an anode over a substrate, an organic compound layer is formed on the anode, and a cathode is formed on the organic compound layer so that light generated in the organic compound layer is emitted toward a TFT through the anode, which is a transparent electrode (hereinafter, the structure is referred to as a bottom emission structure).

[Patent Document 1]: Japanese Patent Application Laid-Open No. 2002-352951

The EL element can be covered with the opposing substrate in the above-mentioned bottom emission structure. However, in the case of a structure in which an electrode is formed as an anode over a substrate, a layer containing an organic compound is formed on the anode, and a cathode that is a transparent electrode is formed on the layer containing the organic compound (hereinafter, the structure is referred to as a top emission structure), an opposing substrate made from a light shielding material cannot be used. Similarly, the same is true in the case of a dual emission structure in which light is simultaneously emitted upward and downward. As compared with the bottom emission structure, in the top emission structure and the dual emission structure, the number of material layers through which light emitted from the layer containing the organic compound passes can be reduced, thereby suppressing stray light generation between the material layers having different refractive indices. In the case of the bottom emission structure, it is necessary to pay minute attention to handling of a drying agent so as not to absorb moisture. Therefore, it has been necessary to encapsulate the drying agent quickly. Further, in the case of the top emission structure and the dual emission structure, when the drying agent is arranged on a pixel portion, the drying agent hinders display.

Further, the substrate with the EL element formed thereon and the opposing substrate are attached to each other with an UV-curable or a heat-curable sealing agent, wherein the EL element exists inside a space hermetically-sealed with the sealing agent, the opposing substrate, and the substrate. It is preferable that moisture and oxygen do not exist in the space and do not penetrate thereinto. When oxygen and moisture exist therein, a problem in which the EL element is deteriorated has been caused. The sealing agent is also referred to as a sealing material.

As compared with the heat-curable sealing agent, the UV-curable sealing agent is quickly cured using a device with smaller size, and therefore the UV-curable sealing agent has advantages in mass production. Therefore, there are many sealing devices for mass production each of which has only a function of UV irradiation as a function of curing the sealing agent. In the case of using such sealing devices, however, the heat-curable sealing agent cannot be used therein.

Further, since the EL element is damaged by UV irradiation and thermal shock, there has been a problem of decreasing the luminance for the EL element and a problem of shortening its lifetime.

When sealing materials before being cured are in contact with each other for a long time, the sealing materials are likely to be mixed with each other, which result in deformation. Further, since a mixed portion of the mixed sealing materials is not cured uniformly, the adhesive strength is likely to be reduced.

In order to overcome the foregoing problems, it is an object of the present invention as disclosed in the specification is to provide a light emitting device having a structure for preventing oxygen and moisture from penetrating into an EL element, and a method of manufacturing the same. Furthermore, with respect to the top-emission structure and the dual-emission structure in addition to the bottom-emission structure, it is an object of the present invention to encapsulate an EL element by uniformly curing all of the sealing materials without inserting a drying agent and damaging the EL element due to the UV irradiation even when a sealing device, which only has a function of UV irradiation, is used.

SUMMARY OF THE INVENTION

According to one aspect of the present invention disclosed in this specification, there is provided a light emitting device including a pixel portion having a plurality of EL elements between a pair of substrates, at least one of which has a light-transmitting property, wherein each of the plurality of EL elements includes: a first electrode; an organic compound layer on and in direct contact with the first electrode; and a second electrode on and in direct contact with the organic compound layer. The light emitting device further includes: a first sealing agent surrounding the pixel portion; and a second sealing agent formed in a region surrounded by the first sealing agent so as to cover the entire surface of the pixel portion, wherein the pair of substrates is attached to each other with the first sealing agent and second sealing agent. As for the first sealing agent, a sealing agent containing a gap material (such as a filer and a fine particle) for maintaining a gap between the pair of substrates can be used. As for the second sealing agent, a transparent sealing agent can be used. Light emitted from the EL element passes through the second sealing agent and one of the pair of substrates. A transparent sealing substrate is used as the one of the pair of substrates, and a substrate with the EL element formed thereon is used as another one of the pair of substrates so that the top emission structure can be completed by pasting these substrates to each other. In addition, light emitted from the EL element can transmit through another one of the pair of substrates with the EL element formed thereon as well as the second sealing agent and the one of the pair of substrates.

When a sealing pattern of the first sealing agent is formed in a square shape, a circular shape, or a semicircular shape which has no air escapeway and a second sealing agent is dropped to attach two pieces of substrates, air bubbles are likely to remain in corners.

Therefore, as shown in FIG. 1 and FIG. 2, according to the light emitting device as disclosed in the specification, the first sealing agent surrounding the pixel portion includes a pair of first patterns formed so as to sandwich the pixel portion and a second pattern surrounding the pixel portion and the pair of first patterns, and at least the second sealing agent is filled between the pair of first patterns. For example, the pair of first patterns is two linear patterns, and the second pattern is a square pattern in which the corners of the second pattern may be curved. The second sealing agent is a heat-curable resin, which does not contain a gap material. After the second sealing agent is thermally cured, the second sealing agent has a light transmitting property. Before adhering the pair of substrates to each other, two sides of the second pattern formed along the pair of first patterns are slightly separated in the vicinity of each midpoint of the two sides respectively as illustrated in FIG. 2A. In attaching the pair of substrates to each other, the two disconnected sides are connected, respectively. The corners of the second pattern are curved so that air bubbles are not generated at the corners when attaching the pair of substrates.

Each end for the pair of first patterns is not contacted to the second pattern, and openings are formed between each end for the pair of first patterns and the second pattern. The openings are formed in the vicinity of the four corners of the pixel portion or in the vicinity of the four corners for the second pattern. By providing the openings, when the two pieces of substrates are attached to each other with the second sealing agent, the second sealing agent is pushed out toward the openings such that an EL element can be encapsulated without mixing air bubbles onto the pixel portion. It is preferable that a surface of a sealing substrate of the pair of substrates be smooth and superior in flatness so that air bubbles does not mix therein.

Since the height of the second sealing agent immediately after application is larger than that of the first sealing agent, when the two pieces of substrates are adhered to each other, the second sealing agent is pressed and spread so as to cover the pixel portion prior to the first sealing agent. At this moment, the pixel portion can be surely covered with the second sealing agent due to the arrangement of the pair of first patterns. Further, after the second sealing agent is spread on the entire surface of the pixel portion, the first sealing agent is subsequently spread. At this moment, gaps in the vicinity of each midpoint of the two sides for the second pattern formed along the pair of first pattern are filled, respectively. The second sealing agent is completely shielded from the outside air by the first sealing agent. Therefore, it is possible to prevent moisture and oxygen from reaching into the EL element by both of the first sealing agent and the second sealing agent.

After adhering the two pieces of substrates, the first sealing agent is cured first by being irradiated with UV light, and then the second sealing agent is subsequently cured by heating. Although the second sealing agent is heated for a long time to be cured, the second sealing agent is not mixed with the first sealing agent since the first sealing agent has been previously cured.

During the UV irradiation, the pixel portion is protected with a light-shielding mask and the like such that the pixel portion is not irradiated with UV light selectively.

When the two pieces of substrates are adhered to each other in the sealing step, a surface of the substrate is continuously and perpendicularly pressed in a direction of pressing the sealing materials between the substrates until the sealing materials are completely cured.

According to the invention as disclosed in the specification, it is not necessary to press the substrate for a long time in a heating step for curing the second sealing agent after the first sealing agent is cured. That is, the substrate has been necessary to be pressed conventionally until the sealing materials are cured in adhering the substrates in the sealing step. However, in the present invention, it is not necessary to press the substrates since the gap between the substrates is constantly maintained after the first sealing agent has been previously cured due to UV irradiation. Accordingly, the sealing step according to the present invention can be carried out in either a sealing device only for a UV-curable sealing agent or a sealing device for both the UV-curable sealing agent and a heat-curable sealing agent.

In the case of sealing an EL element for the top emission structure or the dual emission structure, the second sealing agent is cured by heating rather than by UV irradiation. Accordingly, the pixel portion is not damaged by the UV irradiation, and hence, the problems of decreasing luminance of the EL element and shortening lifetime thereof can be solved.

According to the invention as disclosed in the specification, in the sealing step of the top emission structure and the dual emission structure, the sealing agent covering the pixel portion can be cured without damaging the EL element due to UV irradiation even in the case of using a sealing device that only has a function of UV irradiation. As a result, a light emitting device with high reliability can be obtained.

Since the first sealing agent in the periphery of the pixel portion is cured at short times by being irradiated with UV light prior to the second sealing agent, after curing the first sealing agent, the first sealing agent and the second sealing agent are not mixed with each other even if they are in contact with each other for a long time. Therefore, the sealing materials are not deformed and the adhesive strength thereof is not degraded, thereby providing a light emitting device with higher reliability.

Furthermore, since the second pattern of the first sealing agent is continuously formed, the second pattern of the first sealing agent allows the second sealing agent to be shielded from the outside air completely. Consequently, it is possible to prevent moisture or oxygen from reaching into the EL element by both the first sealing agents and second sealing agent. As a result, a light emitting device with higher reliability can be obtained.

BRIEF DESCRIPTION OF DRAWINGS

FIGS. 5A-5B are diagrams showing a structure of an active matrix light emitting device according to Embodiment 1;

DETAILED DESCRIPTION OF THE PRESENTLY PREFERRED EMBODIMENTS

Embodiment modes of the invention as disclosed in the specification will hereinafter be described.

[Embodiment Mode 1]

FIG. 1 is a top view of an active matrix light emitting device according to the present invention as disclosed in the specification.

Figure 1A:
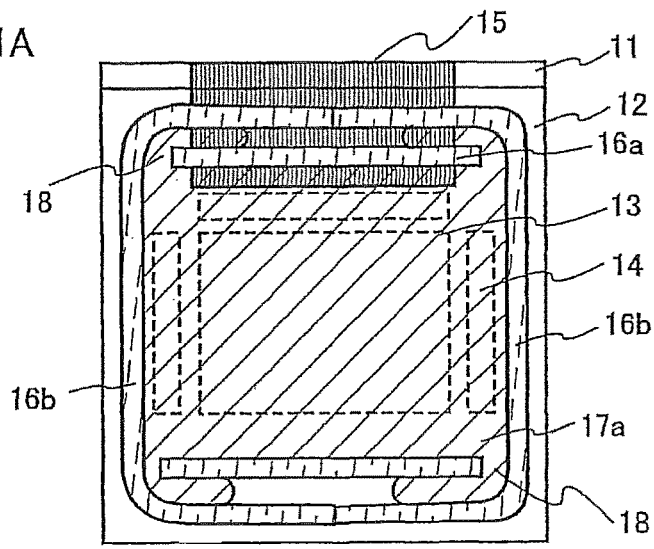
FIGS. 1A-1C are diagrams explaining Embodiment Mode 1.

In FIG. 1A, reference numeral 11 denotes a first substrate; 12, a second substrate; 13, a pixel portion; 14, a driver circuit portion; 15, a terminal portion; each of 16a and 16b; a first sealing agent; and 17a, a second sealing agent.

Though the material for the first substrate 11 is not particularly limited, the first substrate is preferably formed of a material having a same thermal expansion coefficient as that of the second substrate 12 from the viewpoint of attaching to the second substrate 12. In the case of the bottom emission structure, the first substrate 11 is formed of a substrate having a light transmitting property such as a glass substrate, a quartz substrate, and a plastic substrate. In the case of the top emission structure, a semiconductor substrate, a metal substrate, and the like can be used, too. Further, in the case of the dual emission structure, each substrate is made from the material having a light transmitting property. The pixel portion 13 comprising a plurality of EL elements, the driver circuit portion 14, and the terminal portion 15 are formed over the first substrate 11.

An example in which the first sealing agent having a first pattern 16a and a second pattern 16b is arranged so as to surround the pixel portion 13 and the driving circuit portion 14 is shown here. The first sealing agent 16a and 16b are partly overlapped with the terminal portion 15 (or a wiring that extends from a terminal electrode). The first sealing agent 16a and 16b contains a gap material for maintaining a gap between a pair of substrates. Since the first sealing agent contains the gap material, it is preferable that the first sealing agent 16a and 16b do not overlap elements (such as a TFT) so that a short circuit is not caused when some sort of charge is applied thereto. The first sealing agent is composed of a pair of first patterns 16a and a pair of second patterns 16b. The pair of second patterns is formed in a square shape and surrounds the pixel portion. The corners of the second pattern in the square shape may be curved. The pair of first patterns of the first sealing agent has a linear shape and provided inside the second pattern. Openings 18 are formed in the vicinity of the four corners of the second pattern, i.e., between edges of the pair of first patterns and the second pattern. That is, the pair of first linear patterns for the first sealing agent is arranged so as to sandwich the pixel portion. Further, the second pattern in the square shape, which has the curved corners, is arranged so as to surround the pair of first patterns.

At least the second sealing agent 17a is filled between the pair of first patterns 16a of the first sealing agent. The pair of substrates is fixed by the first sealing agent 16a and 16b, which are disposed to surround the pixel portion, and by the second sealing agent 17a, which contacts the first sealing agent and covers the pixel portion. Therefore, the second sealing agent is completely shielded from the outside air with the first sealing agent.

Since the second sealing agent 17a is formed of a material having a light transmitting property after being cured and does not contain a gap material, it has superior light transmitting property as compared with that of the first sealing agent 16a and 16b. The second sealing agent 17a protrudes from the openings 18 formed between each edge of first pattern and the second pattern.

Figure 2A:
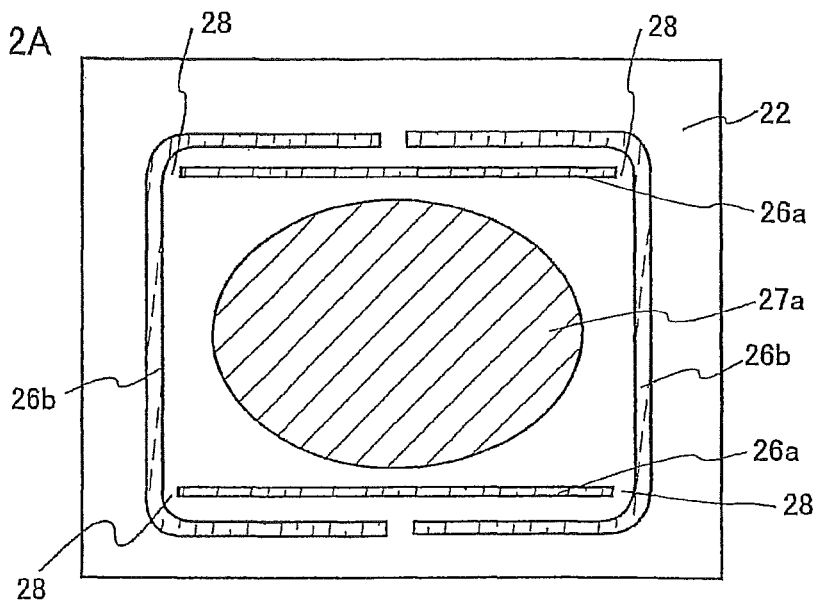
FIGS. 2A-2B are diagrams explaining Embodiment Mode 1.

A mechanism for the second sealing material 17a to take on the shape shown in FIG. 1A will be explained below referring to FIG. 2. FIG. 2A shows an example of a top view for a sealing substrate (a second substrate 22) before being attached to a first substrate. An example of forming a light emitting device having one pixel portion in a sheet of substrate is shown in FIG. 2A.

Figure 2B:
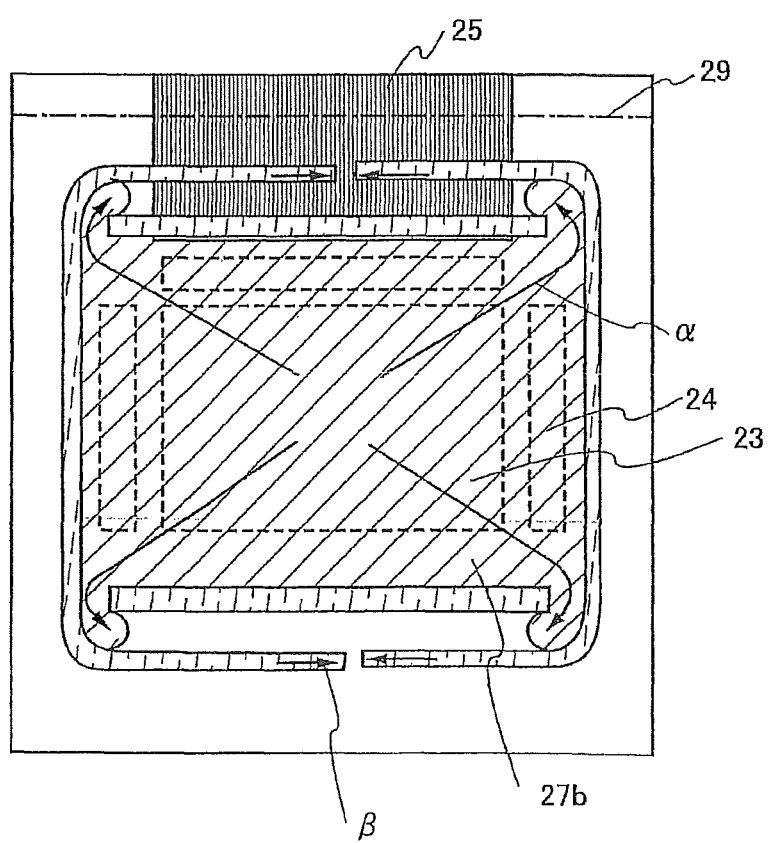

The first sealing agent 26a and 26b are formed over the second substrate 22 by using a dispenser, and then a second sealing agent 27a having a lower viscosity than that of the first sealing agent is dripped between the first patterns for the first sealing agent. FIG. 2A corresponds to a top view of the second substrate with the first sealing agent dripped thereon. Subsequently, the resultant second substrate is attached to a first substrate having a pixel portion 23 with an EL element provided thereon. In the embodiment mode, a driver circuit portion 24 and a terminal portion 25 are further formed over the first substrate. A top view immediately after bonding the first and second substrates is shown in FIG. 2B. The viscosity of the first sealing agent is high, and therefore, the first sealing agent is hardly spread upon bonding. Alternatively, since the viscosity of the second sealing agent is low, the second sealing agent spread quickly and planarly upon bonding, as shown in FIG. 2B.

The second sealing agent is pushed out in the directions of arrows a in FIG. 2B from openings 28 provided between each edge of the first patterns 26a and the second patterns for the first sealing agent. Accordingly, it is possible to prevent air bubbles from being generated in a region where is filled with the second sealing agent. The first sealing agent 26a and 26b is not mixed with the second sealing agent 27b immediately, even when they are in contact with each other. The first sealing agent 26a and 26b comprise a higher viscosity such that the position at which it is formed is not changed due to the second sealing agent 27b unless the first sealing agent 26a and 26b is mixed with the second sealing agent 27b.

The second sealing agent 27b protrudes from the openings 28 in FIG. 2B, and the circumference of the protruding second sealing agent 27b is curved. When the first and second substrates are adhered to each other, disconnected portions of the second patterns for the first sealing agent are spread in the directions of arrows β (FIG. 2B) so as to be connected to each other completely. Therefore, the second sealing agent 27b is completely shielded from the outside air, thereby blocking oxygen or moisture. In addition, since the total adhesion area is increased, the bonding strength is further improved. Although an example of bonding the substrates after forming the first sealing agent or the second sealing agent over the second substrate 22 is shown here, the present invention is not particularly limited thereto. Alternatively, the first sealing agent or the second sealing agent may be formed over the first substrate with elements formed thereon.

The first sealing agent 26a and 26b are then cured by performing UV irradiation. Upon irradiating UV light, the pixel portion is protected from the UV irradiation by using a light shielding mask and the like. In the present embodiment mode, a Cr film formed over a quartz glass is used as the light shielding mask. Thereafter, the second sealing agent 27 is cured by heating. The heating temperature is set so as not to damage the EL element. Concretely, it is preferable that the heating temperature be set in a range of 60° C. to 100° C. Further, the heating temperature is preferably set to 1 hour to 3 hours.

Subsequently, the second substrate 22 is partly separated. A line 29 denoted by a chained line in FIG. 2B indicates a substrate cutting line. When the second substrate is partly separated, the cutting line may be determined parallel along the second pattern 26b of the first sealing agent that is formed over the terminal portion 25.

In accordance with the above-mentioned procedures, the shape of the second sealing agent 17a as illustrated in FIG. 1A can be obtained.

Although the example in which the second sealing agent 17a protrudes from the openings 18 is shown in FIG. 1A, the shape of the second sealing agent 17a may be changed variously by varying the viscosity, amount, or material of the second sealing agent, arbitrarily. Also, the shape of the second sealing agent can be changed variously by adjusting the time, velocity, pressure, and the like of pressing the substrates.

Figure 1B:
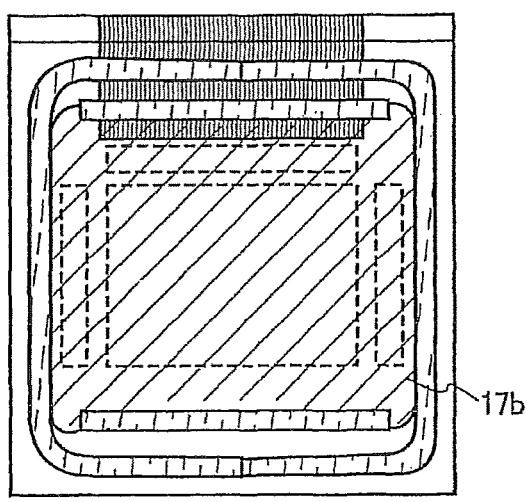
Figure 1C:
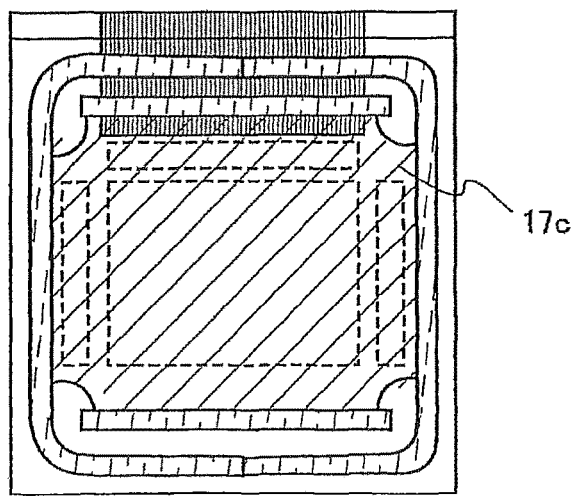

As shown in FIG. 1B, for example, the second sealing agent 17b does not protrude from the openings, and the circumference of the second sealing agent is curved in an arc to fill the gaps of the first sealing agent. Further, as illustrated in FIG. 1C, the circumference of the second sealing agent 17c may be curved, dented from the openings.

Furthermore, the first patterns for the first sealing agent are not limited to the linear shape as long as they are arranged symmetrically, sandwiching the pixel portion therebetween. The laterally-located second pattern of the first sealing agent is not limited to the square shape as long as the second pattern is not disconnected at the time of bonding the pair of substrates. For instance, the shape of the first sealing agent may be slightly curved so as to spread the second sealing agent having lower viscosity easily upon bonding the pair of substrates.

[Embodiment Mode 2]

A part of the cross sectional structure of a pixel portion according to the present invention as disclosed in the specification will hereinafter be described with reference to FIG. 3A.

Figure 3A:
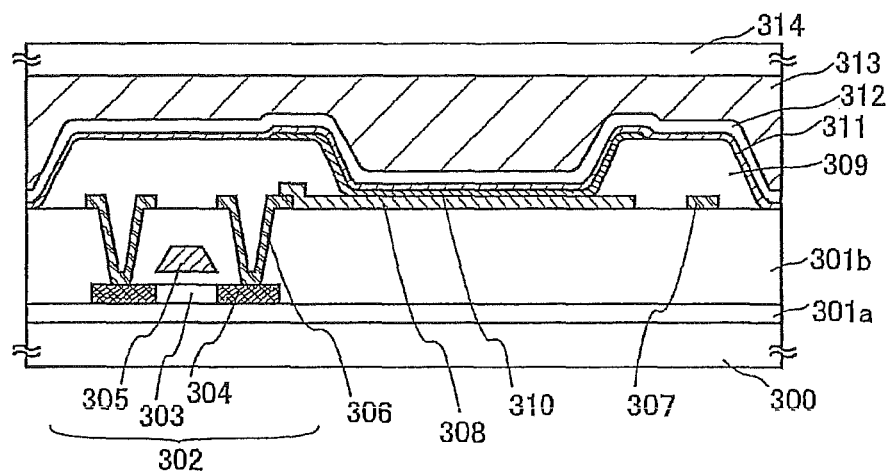
FIGS. 3A-3C are diagrams explaining Embodiment Mode 2.

In FIG. 3A, reference numeral 300 denotes a first substrate; each of 301a and 301b, an insulating layer; 302, a TFT; 308, a first electrode; 309, an insulator; 310, an EL layer; 311, a second electrode; 312, a transparent protective layer; 313, a second sealing agent; and 314, a second substrate.

The TFT (a p-channel TFT) 302 formed over the first substrate 300 is an element for controlling the electric current flowing through the EL layer 310 that emits light. Reference numeral 304 denotes a drain region (or a source region). Reference numeral 306 denotes a drain electrode (or a source electrode) for connecting the first electrode and the drain region (or the source region). Further, a wiring 307 such as a power supply line and a source wiring is formed simultaneously with the drain electrode 306 through the same process. Although an example of forming the first electrode and the drain electrode separately is shown here, they may also be formed at the same time. An insulating layer 301a, which will serve as a base insulating film (including a nitride insulating film as a lower layer and an oxide insulating film as an upper layer here) is formed over the substrate 300. A gate insulating film is formed between a gate electrode 305 and an active layer. Reference numeral 301b denotes an interlayer insulating film made from an organic material or an inorganic material. Further, although not illustrated in the drawing, one or a plurality of TFTs (n-channel TFTs or p-channel TFTs) is additionally provided in one pixel. Furthermore, although the TFT having one channel formation region 303 is shown here, the present invention is not particularly limited thereto, and a TFT having a plurality of channel formation regions may also used.

Reference numeral 308 denotes the first electrode, i.e., an anode (or a cathode) of an OLED. As a material for the first electrode 308, a film of an element selected from Ti, TiN, $TiSi_xN_y$, Ni, W, $WSi_x$, $WN_x$, $WSi_xN_y$, NbN, Mo, Cr, Pt, Zn, Sn, In, and Mo, or a film of an alloy material or a chemical compound material including the above-mentioned elements as its principal constituent, or a lamination film of such films may be used with a total film thickness in a range of 100 nm to 800 nm. A titanium nitride film is used as the first electrode 308 here. When the first electrode 308 is made from the titanium nitride film, it is preferable that the work function be increased by performing UV irradiation or a plasma treatment using chlorine gas on the surface of the titanium nitride film.

The insulator 309 (also referred to as a bank, a partition wall, a barrier, an embankment etc.) is formed so as to cover edges of the first electrode 308 (and wirings 307). The insulator 309 may be formed of inorganic materials (such as silicon oxide, silicon nitride, and silicon oxynitride); photosensitive or nonphotosensitive organic materials (such as polyimide, acrylic, polyamide, polyimide amide, resist, and benzocyclobutene); laminations of these substances; and the like. A photosensitive organic resin covered with a silicon nitride film is used here. When a positive photosensitive acrylic is used as the organic resin material, for example, it is preferable that only an upper edge of the insulator be curved to have a radius of curvature. In addition, the insulator may also formed of either negative photosensitive organic materials which become insoluble in etchants by being irradiated with light, or positive photosensitive organic materials which become soluble in etchants by being irradiated with light.

A layer 310 containing an organic compound is formed by vapor deposition or application. In order to improve the reliability, it is preferable to perform a vacuum heat treatment prior to forming the layer 310 containing the organic compound so as to carry out degasification. For example, in the case of using the vapor deposition technique, vapor deposition is carried out in the film formation chamber, which has been vacuum evacuated to a pressure equal to or less than $5 \times 10^{-2}$ Torr (0.665 Pa), more preferably, to a pressure between $10^{-4}$ to $10^{-6}$ Pa. The organic compound evaporates in advance with resistive heating, and is dispersed toward the substrate by opening a shutter at the time of vapor deposition. The evaporating organic compound is dispersed upward, and is vapor deposited over the substrate through an opening portion provided in a metal mask.

For example, white light emission can be obtained by sequentially laminating $Alq_3$, $Alq_3$ partially doped with Nile red that is a red color light emitting pigment, $Alq_3$, p-EtTAZ, and TPD (aromatic diamine) by vapor deposition.

Further, when the layer containing the organic compound is formed by application using spin coating, it is preferable to bake the layer by using the vacuum heating treatment after its application. For example, an aqueous solution of poly-(ethylene dioxythiophene)/poly-(styrene sulfonic acid) (PE-DOT/PSS), which functions as a hole injecting layer, may be applied over the entire surface of the substrate and baked. Then, a solution of polyvinyl carbazole (PVK) doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red, and coumarin 6), which serves as a light-emitting layer, may then be applied over the entire surface and baked. Note that water is used as the solvent for PEDOT/PSS, which is insoluble in an organic solvent. Consequently, there is in no danger of being dissolved again in the case where PVK is applied thereupon. Further, the solvents used for PEDOT/PSS and PVK are different from each other, and therefore it is preferable that one film formation chamber be not used for both materials.

The layer 310 containing an organic compound may be formed to have a single layer. In this case, 1,3,4-oxadiazole derivative (PBD) which has electron transporting properties may be dispersed in polyvinyl carbazole (PVK) which has hole transporting properties. In addition, white light emission can also be obtained by dispersing 30 wt % of PBD as an electron transporting agent and dispersing a suitable amount of four kinds of pigments (TPB, coumarin 6, DCM1, and Nile red).

Reference numeral 311 denotes a second electrode made from a conductive film, i.e., a cathode (or an anode) of the OLED. As a material for the second electrode 311, an alloy such as MgAg, MgIn, AlLi, $CaF_2$, and CaN, or a film having a light transmitting property formed by co-depositing aluminum and an element belonging to group 1 or group 2 of the periodic table may be used. The top emission structure that emits light through the second electrode is manufactured here, and therefore, the second electrode is formed of an aluminum film with a thickness of 1 to 10 nm or an aluminum film containing minute amounts of Li.

When a structure using an Al film is employed as the second electrode 311, a material being in contact with the layer 310 containing the organic compound can be formed of a material other than an oxide, thereby improving the reliability of the light emitting device. Alternatively, a layer having a light transmitting property (with a thickness of 1 to 5 nm) made from $CaF_2$, $MgF_2$, or $BaF_2$ may be formed as a cathode buffer layer prior to forming the aluminum film with a thickness of 1 to 10 nm.

Further, in order to reduce the resistivity of the cathode, an auxiliary electrode may be formed over the second electrode 311 in a region where does not become a light emitting region. The cathode may be formed selectively by vapor deposition with resistive heating, and using an evaporation mask upon cathode formation.

Reference numeral 312 denotes the transparent protective layer formed by vapor deposition to protect the second electrode 311 made from a thin metal film. The transparent protective layer 312 is further covered with the second sealing agent 313. Since the second electrode 311 is composed of the extremely thin metal film, when the second electrode is exposed to oxygen, it is easily oxidized etc. There is a possibility that the second electrode 311 will react with a solvent contained in the sealing agent and the like, changing its properties.

Therefore, the second electrode 311 made from the thin metal film is covered with the transparent protective film 312, for example, $CaF_2$, $MgF_2$, or $BaF_2$, so as to prevent the second electrode from being reacted with components such as a solvent contained in the second sealing agent 313. In addition, oxygen or moisture can be blocked efficiently without using a drying agent. Further, $CaF_2$, $MgF_2$, or $BaF_2$ can be formed by vapor deposition. Therefore, the cathode and the transparent conductive film can be successively formed by vapor deposition so as to prevent impurities from intruding thereinto or prevent the surface of the second electrode from being exposed to the outside air. In addition, when the vapor deposition is employed, the transparent protective layer 312 can be formed without causing major damage to the layer containing the organic compound. Note that, the second electrode 311 may further be protected by forming layers having light transmitting properties that are made from $CaF_2$, $MgF_2$, or $BaF_2$ on and under the second electrode so as to sandwich the second electrode therebetween.

Further, a region between the first electrode and the second electrode can be maintained in an oxygen free state with an oxygen concentration as close to zero as possible by using structures as follows. The first electrode is formed of a metal (a high work function material) including no oxygen atoms itself such as a titanium nitride film, the second electrode is formed of a metal (a low work function material) including no oxygen atoms itself such as a thin aluminum film, and the second electrode is covered with $CaF_2$, $MgF_2$, or $BaF_2$.

The first substrate 300 and the second substrate 314 are adhered to each other with the second sealing agent 313 in the same manner as Embodiment Mode 1. As for the second sealing agent 313, a heat curable resin, which will have a light transmitting property after being cured, may be employed. A highly heat-resisting heat curable epoxy resin including the specific gravity of 1.17 (25° C.); the viscosity of 9000 mPa·s; the tensile shear strength of 15 N/mm$^2$; and a Tg (glass transition temperature) of 74° C. is used here. Further, the overall light transmittance can be improved by filling the second sealing agent 313 between the pair of substrates.

Figure 7:
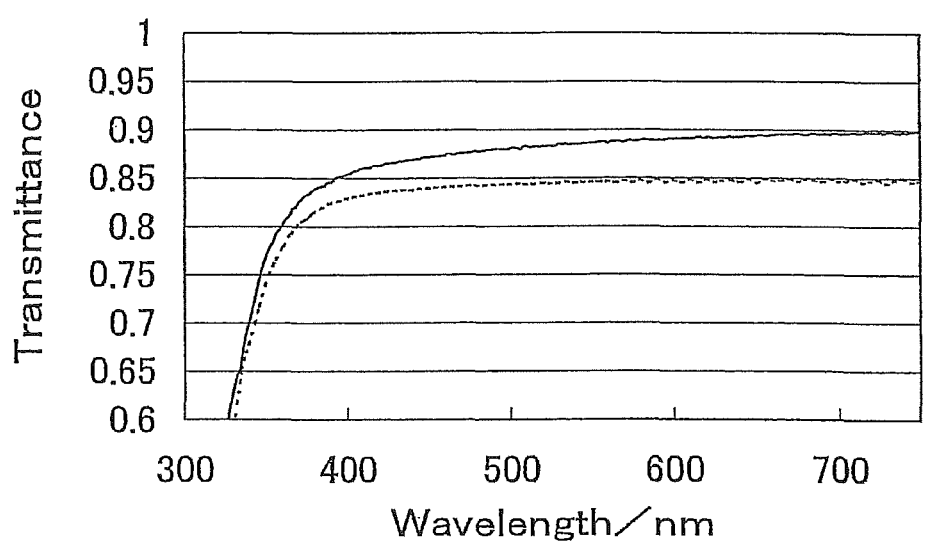
FIG. 7 is a graph showing an improved light transmittance due to a second sealing agent.

The light transmittances were found in the following cases respectively: when a space between the pair of glass substrates is filled with the second sealing agent; and when the space between the pair of glass substrates is filled with a nitrogen gas. FIG. 7 shows a graph in which the light transmittances of the former case are denoted by a solid line and the light transmittances of the latter case are denoted by a dotted line. As shown in FIG. 7, the light transmittances in the case of filling the second sealing agent between the pair of glass substrates exhibit equal to or grater than 85% in the visible light region. In FIG. 7, a longitudinal axis indicates the light transmittance whereas a horizontal axis indicates the light wavelength.

Figure 3B:
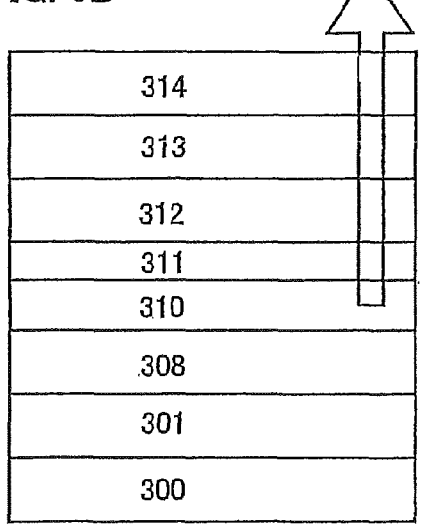

FIG. 3B is a diagram of a simplified lamination structure in a light emitting region. Light is emitted in a direction denoted by an arrow in FIG. 3B. In each FIG. 3B and FIG. 3C, the insulating layer 301a and insulating layer 301b are collectively denoted as an insulating layer 301.

Figure 3C:
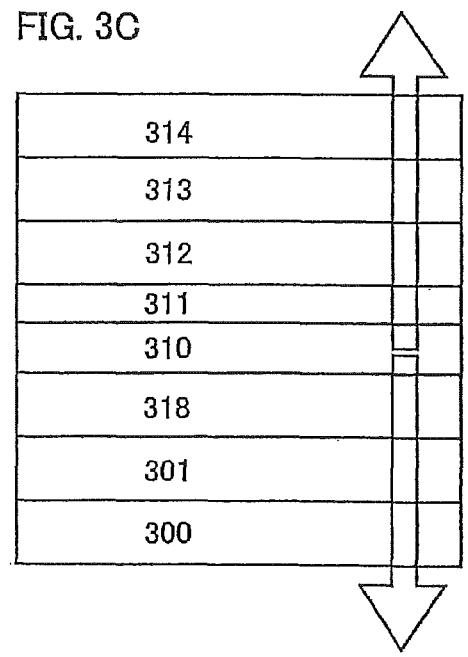

When a first electrode 318 formed of a transparent conductive film is used as illustrated in FIG. 3C in place of the first electrode 308 made from the metal layer, light can be emitted through both the top surface and the bottom surface. As for the transparent conductive film, ITO (indium oxide-tin oxide alloy), indium oxide-zinc oxide alloy ($In_2O_3$—ZnO), zinc oxide (ZnO), and the like may be used. The transparent conductive film may be formed by sputtering using a target of ITO mixed with silicon oxide. The present embodiment mode can be freely combined with Embodiment Mode 1.

[Embodiment Mode 3]

FIG. 4 shows a case of forming a plurality of pixel portions on one substrate, that is, an example of multiple patterns. An example of forming four panels on one substrate is shown here.

Figure 4A:
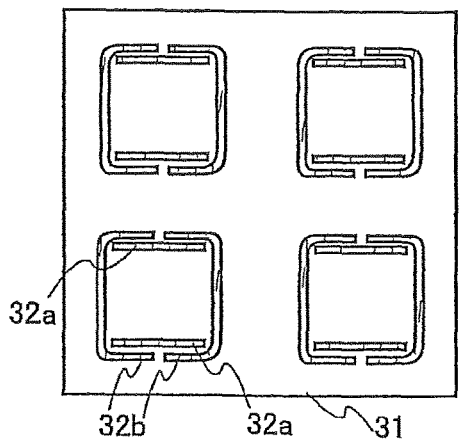
FIGS. 4A-4E are diagrams explaining Embodiment Mode 3.

As illustrated in FIG. 4A, a first sealing agent having first patterns 32a and second patterns 32b is formed in predetermined positions over a second substrate 31 under an inert gas atmosphere by using a dispenser apparatus. As for the first translucent sealing agent 32a and 32b, a material including filler (6 μm to 24 μm in diameter) with the viscosity of 370 Pa·s is used. Since the first sealing agent 32a and 32b are simple sealing patterns, they can also be formed by the printing technique.

Figure 4B:
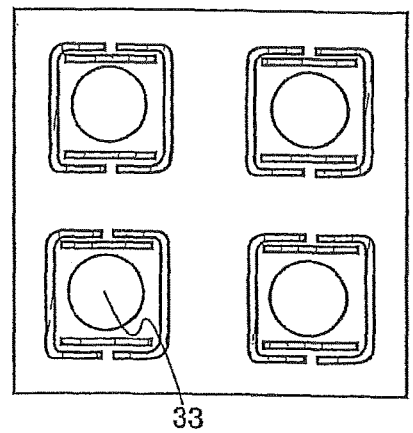

As depicted in FIG. 4B, a second sealing agent 33, which will have a light transmitting property after being cured, is dropped into each region surrounded by the first patterns 32a and second patterns 32b of the first sealing agent (note that, openings are formed between the edges of the first patterns and second patterns). A highly heat-resisting heat curable epoxy resin having the specific gravity of 1.17 (25° C.); the viscosity of 9000 mPa·s; the tensile shear strength of 15 N/mm$^2$; and a Tg (glass transition temperature) of 74° C. is used here.

Figure 4C:
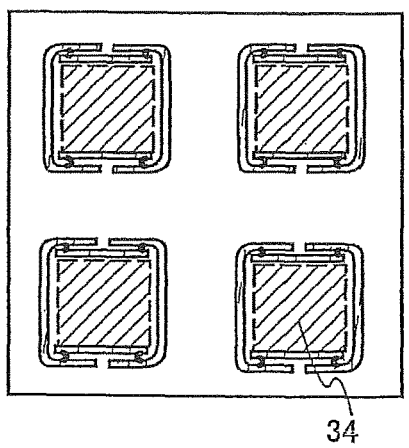

Subsequently, as illustrated in FIG. 4C, a first substrate with four pixel portions 34 formed thereon and the second substrate with the sealing agents formed thereon are attached to each other. It is preferable that degasification be performed by annealing in vacuum immediately before attaching the pair of substrates. The second sealing agent 33 is spread out so as to form the shapes as depicted in FIG. 1A, FIG. 1B, or FIG. 1C, and filled between the first sealing agent 32a and 32b. Depending upon the shapes and arrangement of the first patterns 32a and second patterns 32b of the first sealing agent, the second sealing agent 33 can be made to fill therebetween without introduction of air bubbles.

The first sealing agent 32a and 32b are cured by being irradiated with UV light. Upon irradiating the UV light, each pixel region is selectively protected from the UV light using a light shielding plate etc. Thereafter, the second sealing agent 33 is cured by heating. At this moment, the heating temperature is set so that EL elements are not damaged. Concretely, it is preferable that the heating temperature be set in the range of from 60° C. to 100° C. Preferably, the heating treatment is carried out for 1 to 3 hours.

Figure 4D:
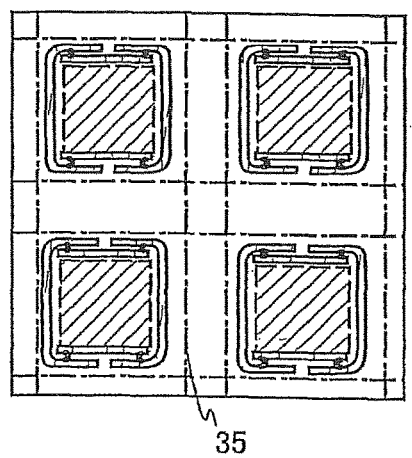

Next, scribe lines 35 depicted in chained lines are formed by using a scriber apparatus as shown in FIG. 4D. The scribe lines 35 may be formed along the second patterns of the first sealing agent.

Figure 4E:
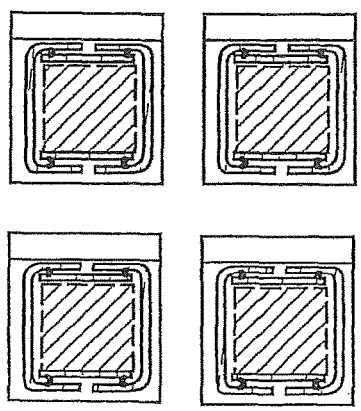

The first and second substrates are divided using a breaker apparatus. Four panels can thus be manufactured from the pair of substrates as depicted in FIG. 4E.

Further, this embodiment mode can be freely combined with Embodiment Mode 1 or Embodiment Mode 2.

The present invention as disclosed in the specification including the above structures will be described in more detail in embodiments below.

[Embodiment 1]

An example of a light-emitting device comprising an EL element that uses a layer containing an organic compound as a light emitting layer will be described in the present embodiment with reference to FIG. 5.

FIG. 5A is a top view of the light-emitting device and FIG. 5B is a cross-sectional view taken along a line A-A' of FIG. 5A. Reference numeral 1101 denoted by a doted line is a source signal line driver circuit; 1102, a pixel portion; and 1103, a gate signal line driver circuit. Further, reference numeral 1104 denotes a sealing substrate and reference numeral 1105 denotes a first sealing agent. Inside surrounded by the first sealing agent 1105 is filled with a second transparent sealing agent 1107. Note that, the second sealing agent 1107 protrudes at four corners on a pixel region.

Reference numeral 1108 is a wiring for transmitting signals inputted to the source signal driver circuit 1101 and the gate signal line driver circuit 1103, and receives a video signal and a clock signal from a FPC (flexible printed circuit) 1109 that becomes an external input terminal. Though only the FPC is shown here, a print wiring board (PWB) may be attached to the FPC. A light emitting device in this specification includes not only a light emitting device body but also a light emitting device attached with the FPC or the PWB.

Next, a cross sectional structure will be described referring to FIG. 5B. A driver circuit and a pixel portion are formed over the substrate 1110. Here, the source signal line driver circuit 1101 as a driver circuit and the pixel portion 1102 are shown.

A CMOS circuit composed by combining an n-channel TFT 1123 and a p-channel TFT 1124 is formed as the source signal line driver circuit 1101. The TFT forming the driver circuit may be formed of a known CMOS circuit, PMOS circuit, or NMOS circuit. This embodiment shows a built-in driver in which a driver circuit is formed over the substrate, but not necessarily limited thereto. The driver circuit can be formed not over the substrate but at an exterior portion thereof.

The pixel portion 1102 is composed of a plurality of pixels including a switching TFT 1111, a current controlling TFT 1112, and a first electrode (anode) 1113, which is electrically connected to a drain of the current controlling TFT 1112.

Since the first electrode 1113 is directly contacted to the drain of the TFT, the bottom layer of the first electrode 1113 is preferably formed of a material layer that can have an ohmic contact with the drain made from silicon. The surface of the first electrode 1113, which is in contact with a layer containing an organic compound, is preferably a material layer that has a high work function. When the first electrode 1113 is composed of a three-layered structure, for example, including a titanium nitride film, an aluminum-based film, and a titanium nitride film, the first electrode can be reduced in resistivity as a wiring, be good ohmic contact to the drain, and function as an anode. In addition, the first electrode 1113 can be formed either of a single layer of a titanium nitride film or a lamination structure of three or more layers.

An insulator (referred to as a bank, a partition wall, a barrier, an embankment, etc.) 1114 is formed on each end of the first electrode (anode) 1113. The insulator 1114 may be made from an organic resin film or an insulating film containing silicon. Here, a positive photosensitive acrylic resin film is used to form the insulator 1114 having a shape as illustrated in FIG. 5B. The insulator 1114 may be covered with a protective film made from an aluminum nitride film, an aluminum nitride oxide film, or a silicon nitride film. The protective film is an insulating film including silicon nitride or silicon nitride oxide as its principal constituent that is obtained by sputtering (such as DC sputtering or RF sputtering); or a thin film including carbon as its principal constituent. When a silicon target is used for forming the protective film under an atmosphere containing nitrogen and argon, a silicon nitride film can be obtained. Alternatively, a silicon nitride target may be used. The protective film may be formed by using a film formation device using remote plasma. It is preferable that the thickness of the protective film be formed to be as thin as possible such that light can pass therethrough.

A layer 1115 containing an organic compound is selectively formed on the first electrode (anode) 1113 by vapor deposition using an evaporation mask or by ink-jetting. Further, a second electrode (cathode) 1116 is formed on the layer 1115 containing the organic compound. Therefore, an EL element 1118 including the first electrode (anode) 1113, the layer 1115 containing the organic compound, and the second electrode (cathode) 1116 can be formed. The embodiment shows an example in which the light emitting element 1118 emits white light, and therefore a color filter formed of a coloring layer 1131 and a BM (light shielding layer) 1132 (an over coat layer is not shown here for the sake of simplification) is provided. Reference numeral 1117 denotes a transparent protective layer.

When layers containing the organic compound, which can exhibit R, G and B luminescence respectively, are formed selectively, full color display can be realized without using a color filter.

In order to encapsulate the EL element 1118 formed over the substrate 1110, the sealing substrate 1104 is attached to the substrate 1110 with the first sealing agent 1105 and the second sealing agent 1107. An epoxy resin is preferably used for the first sealing agent 1105 and the second sealing agent 1107. It is desirable that the first sealing agent 1105 and the second sealing agent 1107 be formed of materials, which do not transmit moisture and oxygen as much as possible.

In this embodiment, a plastic substrate made from FRP (fiberglass-reinforced plastics), PVF (polyvinylfluoride), Mylar, polyester, acrylic, and the like can be used as the sealing substrate 1104, besides a glass substrate and a quartz substrate. After the sealing substrate 1104 is adhered to the substrate 1110 with the first sealing agent 1105 and the second sealing agent 1107, a third sealing agent can be used for sealing to cover the side surfaces (exposed surfaces).

As set forth above, by encapsulating with the first sealing agent 1105 and the second sealing agent 1107, the EL element can be completely shielded from the outside, thereby preventing substances that promotes deterioration of the layer containing the organic compound such as moisture and oxygen from penetrating into the EL element. Therefore, the light emitting device with high reliability can be obtained. The present embodiment can be freely combined with any one of Embodiment Modes 1 to 3.

[Embodiment 2]

Figure 6A:
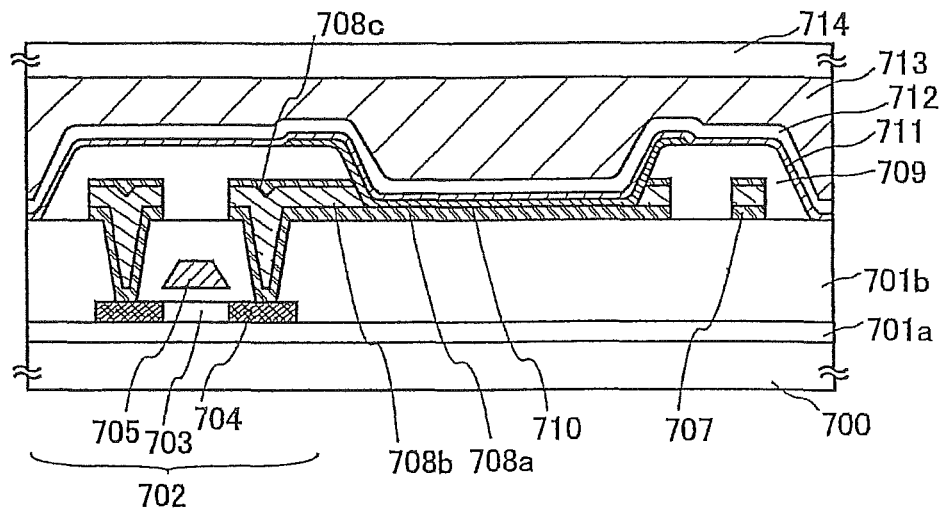
FIGS. 6A-6B are diagrams explaining Embodiment 2.

In this embodiment, examples having different cross sectional structure from that of Embodiment Mode 2 will be shown in FIG. 6. In FIG. 6A, reference numeral 700 denotes a first substrate; each of 701*a* and 701*b*, an insulating layer; 702, a TFT; 709, an insulator; 710, an EL layer; 711, a second electrode; 712, a transparent protective layer; 713, a second sealing agent; and 714, a second substrate.

The TFT 702 (p-channel TFT) formed over the first substrate 700 is an element for controlling the electric current that flows through the EL layer 710 to emit light. Reference numeral 704 denotes a drain region (or a source region). Reference numeral 705 denotes a gate electrode. Though not shown in the drawings, one or a plurality of TFTs (n-channel TFTs or p-channel TFTs) is additionally provided for each pixel. Further, a TFT having one channel formation region 703 is illustrated here, but the present invention does not particularly limited thereto, and the TFT may have plural channels.

FIG. 6A shows a structure formed as follows. First electrodes 708*a* to 708*c* made by laminating metal layers are formed, and an insulator 709 (also referred to as a bank, partition wall, and the like) for covering each end of the first electrode is formed. Etching is performed in a self-aligning manner using the insulator 709 as a mask, and then, a part (a center portion) of each first electrode is etched thinly to form steps therein in addition to etching a part of the insulator. By this etching, the center portion of the first electrode is made thin and flat, and each end of the first electrode covered with the insulator is made thick. That is, the first electrode has a concave shape. Then, the layer 710 containing the organic compound and the second electrode 711 are formed over the first electrode to complete the EL element.

The structure as depicted in FIG. 6A is the one for increasing an amount of emitted light that is extracted in a certain direction (in the direction passing through the second electrode) by reflecting or condensing light emitted in the lateral direction in a slope formed in the steps of the first electrode.

Thus, the metal layer 708b having a slope is preferably made from a metal that reflects light, for example, a material including aluminum or silver as its main constituent. The metal layer 708a being in contact with the layer 710 containing the organic compound is preferably formed of an anode material having a high work function or a cathode material having a small work function. At the same time, since a wiring 707 such as a power supply line and a source wiring is formed, it is preferable that a low resistive material be selected for the metal layer 708a.

The angle of gradient (also referred to as a taper angle) in the slope toward the center portion of the first electrode is preferably set to more than 50° and less than 60°, more preferably, 54.7°. It is necessary to set the angle of gradient, a material and thickness of the organic compound layer, or a material and thickness of the second electrode appropriately so that light reflected by the slope of the first electrode is not dispersed or strayed between layers.

In this embodiment, reference numeral 708a is formed of a lamination layer of a titanium film (60 nm thick) and a titanium nitride film (100 nm thick); reference numeral 708b is formed of an aluminum film (350 nm thick) containing trace amounts of Ti; and reference numeral 708c is formed of a titanium film (100 nm thick). Reference numeral 708c protects reference numeral 708b so as to prevent the aluminum film from being caused hillock or changed its properties. Alternatively, reference numeral 708c may be formed of a titanium nitride film so as to have a light shielding property and prevent reflection of light at the aluminum film. The titanium film is used for the bottom layer of the lamination layer 708a so as to have a good ohmic contact with the drain region (or source region) 704 composed of silicon. However, the present invention is not particularly limited thereto, and the bottom layer of the lamination layer 708a may be formed of other metal film. Alternatively, reference numeral 708a can be formed of a single layer of a titanium nitride film.

It is necessary to carry out an UV irradiation treatment or a plasma treatment such that the titanium nitride film is used as an anode in this embodiment. Since the surface of the titanium nitride film is subjected to the plasma treatment simultaneously with the etching treatment of reference numerals 708b and 708c, the titanium nitride film can obtain a sufficient work function as the anode.

As the other anode materials as substitute for the titanium nitride film, it is possible to use a film of an element selected from the group consisting of Ni, W, $WSi_x$, $WN_x$, $WSi_xN_y$, NbN, Mo, Cr, Pt, Zn, Sn, In, and Mo; a film composed of an alloy material or a compound material including the above-mentioned elements as its principal constituent; or a lamination layer of such films in the total film thickness of 100 nm to 800 nm.

In the structure shown in FIG. 6A, since etching is performed in a self-aligning manner using the insulator 709 as a mask, the number of masks is not increased any more. Thus, a top emission light emitting device can be manufactured with a small number of masks and steps in total.

Figure 6B:
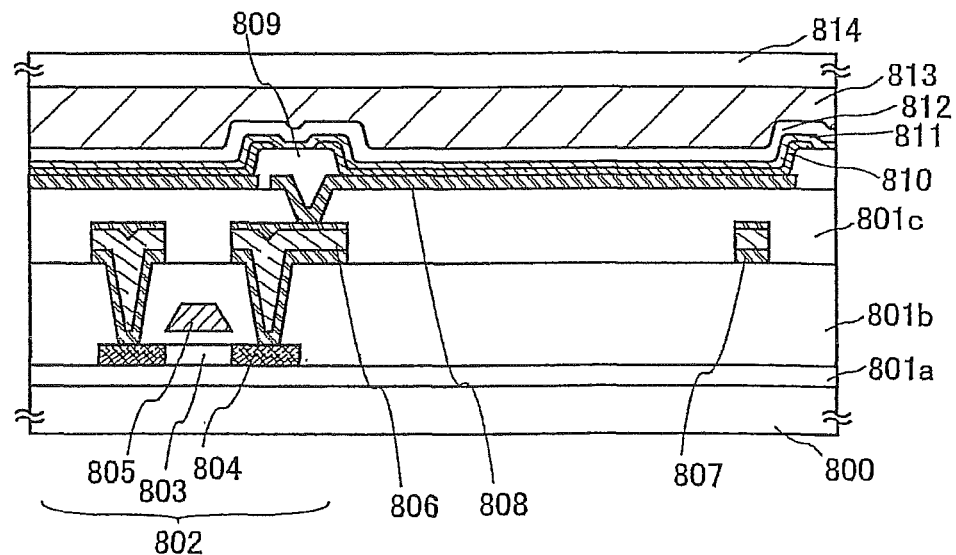

FIG. 6B shows a different structure from that of FIG. 6A. In the structure shown in FIG. 6B, an insulating layer 801c is used as an interlayer insulating film, and the first electrode and the drain electrode (or the source electrode) are provided for different layers, respectively. Consequently, the light-emitting area can be enlarged, although the number of masks increases.

In FIG. 6B, reference numeral 800 denotes a first substrate; reference numerals 801a, 801b, and 801c are insulating layers; reference numeral 802 denotes a TFT (a p-channel TFT); 803, a channel formation region; 804, a drain region (or a source region); 805, a gate electrode; 806, a drain electrode (or a source electrode); 807, a wiring; 808, a first electrode; 809, an insulator; 810, an EL layer; 811, a second electrode; 812, a transparent protective layer; 813, a second sealing agent; and 814, a second substrate.

When a transparent conductive film is used for the first electrode 808, a dual-emission light emitting device can be manufactured.

This embodiment can be freely combined with any one of Embodiment Modes 1 to 3, and Embodiment 1.

[Embodiment 3]

According to the present invention, all electronic appliances incorporating modules each of which includes a layer containing an organic compound (such as an active matrix EL module and a passive matrix EL module) can be completed.

Examples for the electronic appliances typically include a video camera; a digital camera; a head mounted display (a goggle type display); a car navigation system; a projector; a car stereo; a personal computer; a portable information terminal (such as a mobile computer, a cellular phone, and an electronic book); and the like. Practical examples thereof are shown in FIG. 8 and FIG. 9.

Figure 8A:
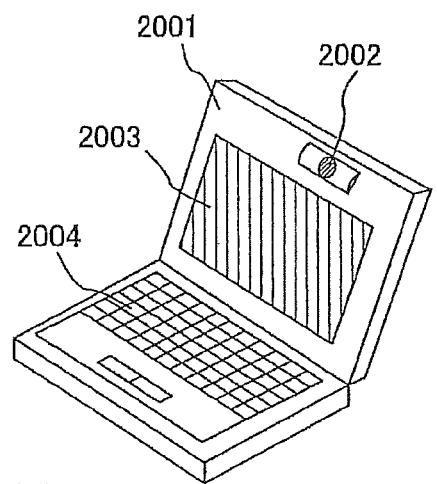
FIGS. 8A-8E are diagrams showing examples for electronic appliances according to Embodiment 3.

FIG. 8A is a personal computer including a main body 2001; an image input portion 2002; a display portion 2003; a keyboard 2004; and the like.

Figure 8B:
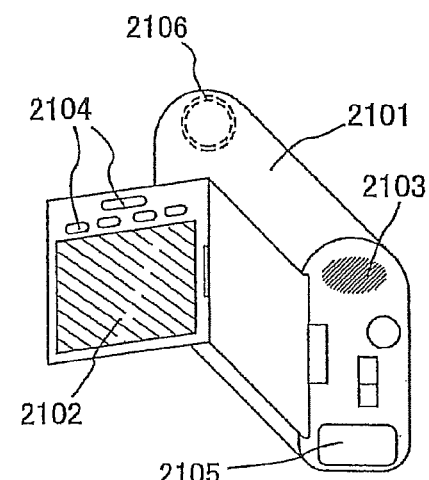

FIG. 8B is a video camera including a main body 2101; a display portion 2102; an audio input portion 2103; operation switches 2104; a buttery 2105; an image receiving portion 2106; and the like.

Figure 8C:
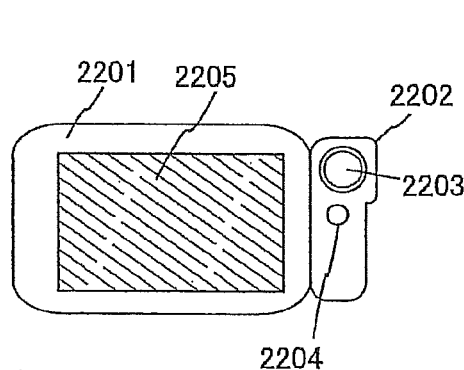

FIG. 8C is a mobile computer including a main body 2201; a camera portion 2202; an image receiving portion 2203; an operation switch 2204; a display portion 2205; and the like.

Figure 8D:
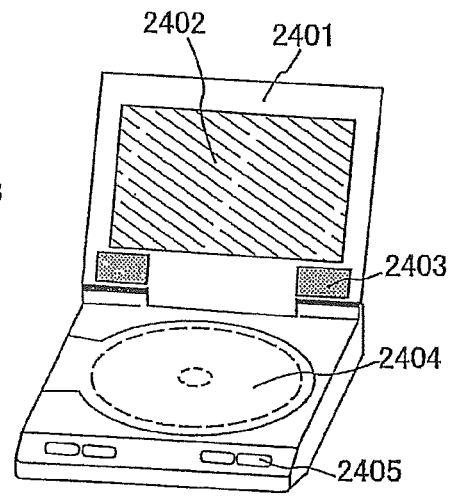

FIG. 8D is a player using a recording medium that records a program (hereinafter referred to as a recording medium), including a main body 2401; a display portion 2402; a speaker portion 2403; a recording medium 2404; operation switches 2405; and the like. The player can be used for music appreciation, film appreciation, games, and Internet by using a DVD (digital versatile disc), a CD, and the like.

Figure 8E:
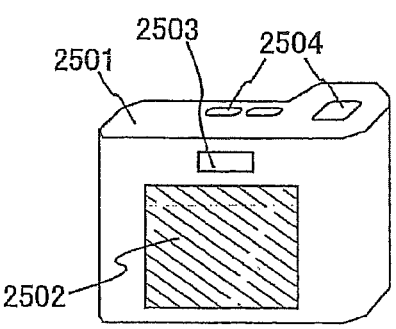

FIG. 8E is a digital camera including a main body 2501; a display portion 2502; a view finder 2503; operation switches 2504; an image receiving portion (not shown); and the like.

Figure 9A:
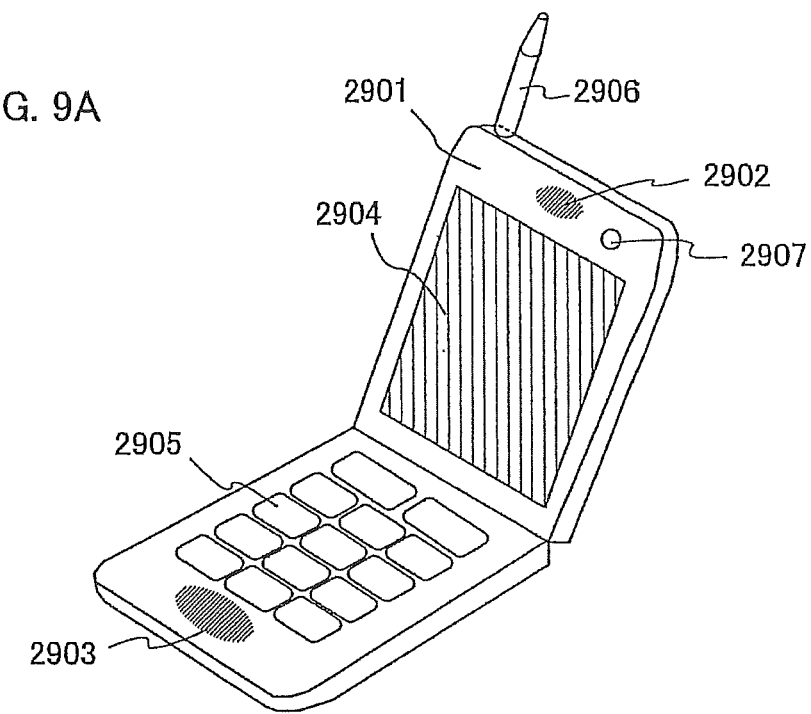
FIGS. 9A-9C are diagrams showing examples for electronic appliances according to Embodiment 3.

FIG. 9A is a cellular phone including a main body 2901; an audio output portion 2902; an audio input portion 2903;

a display portion 2904; operation switches 2905; an antenna 2906; an image input portion (such as a CCD and an image sensor) 2907; and the like.

Figure 9B:
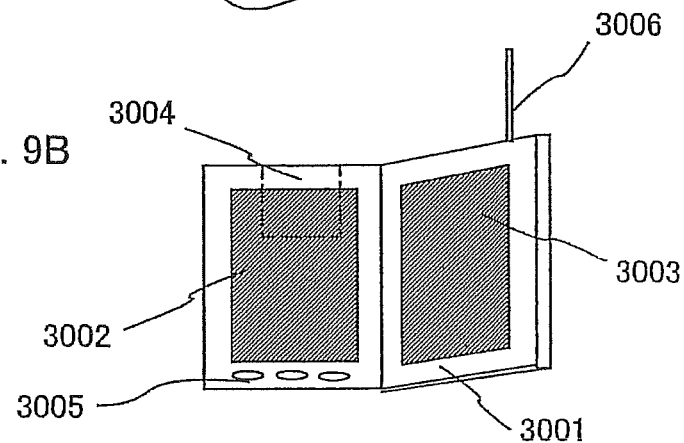

FIG. 9B is a portable book (an electronic book) including a main body 3001; display portions 3002 and 3003; an recording medium 3004; operation switches 3005; an antenna 3006; and the like.

Figure 9C:
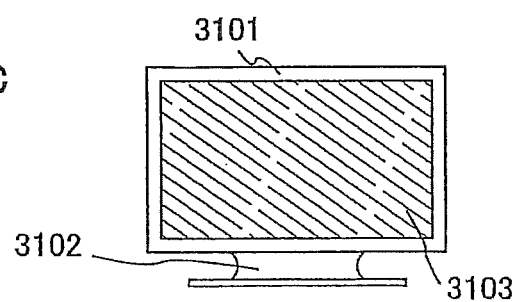

FIG. 9C is a display including a main body 3101; a supporting base 3102; a display portion 3103; and the like.

Note that, the display as illustrated in FIG. 9C is a small and medium sized or large sized display, for example, having a 5 to 20 inch screen. For the sake of manufacturing a display portion with such sizes, it is preferable to mass-produce by multiple pattern by using a substrate with one meter on a side.

As set forth above, the application range of the present invention as disclosed in the specification is extremely large, and can be applied to method of manufacturing electronic appliances in various fields. The electronic appliances in the embodiment can be achieved by utilizing any combination of Embodiment Modes 1 to 3, and Embodiments 1 and 2.

The invention claimed is:

1. A display device comprising:
   a first substrate having a pixel portion, the pixel portion comprising a transistor;
   a first electrode including a first layer comprising titanium and a second layer comprising aluminum over the first layer, the first electrode having a first region electrically connected to the transistor, a second region adjacent to the first region, and a third region adjacent to the second region, wherein the second region is located between the first region and the third region, and a thickness of the second region is smaller than thicknesses of the first region and the third region;
   an insulating layer on the first region and the third region of the first electrode, edges of the insulating layer aligned with edges of the first region and the third region;
   a light emitting layer on and in contact with the second region of the first electrode and the insulating layer;
   a second electrode on the light emitting layer;
   a second substrate over the first substrate and the second electrode;
   a first sealing agent between the first substrate and the second substrate, a pattern shape of the first sealing agent having a quadrilateral shape along sides of the second substrate and having at least one opening; and
   a second sealing agent between the first substrate and the second substrate, the second sealing agent being provided on the inside of the first sealing agent and covering the pixel portion,
   wherein the opening of the first sealing agent is filled with the second sealing agent.

2. The display device according to claim 1,
   wherein each of the first region and the third region of the first electrode includes at least the first layer and the second layer, and
   wherein the second region of the first electrode includes the first layer.

3. The display device according to claim 1, wherein the first sealing agent includes a gap material maintaining a gap between the first substrate and the second substrate.

4. The display device according to claim 1, wherein the first sealing agent comprises an UV curable epoxy resin.

5. The display device according to claim 1, wherein the second sealing agent has a light transmitting property.

6. The display device according to claim 1, wherein the second sealing agent comprises a heat curable epoxy resin.

7. A display module comprising the display device according to claim 1, further comprising a driver circuit portion and a terminal portion over the first substrate.

8. An electronic appliance including the display device according to claim 1, wherein the electronic appliance is selected from the group consisting of a video camera, a digital camera, a head mounted display, a goggle type display, a car navigation system, a projector, a car stereo, a personal computer, a portable information terminal, a mobile computer, a cellular phone, and an electronic book.

9. A display device comprising:
   a first substrate having a pixel portion, the pixel portion comprising a transistor;
   a first electrode including a first layer comprising titanium and a second layer comprising aluminum over the first layer, the first electrode having a first region electrically connected to the transistor, a second region adjacent to the first region, and a third region adjacent to the second region, wherein the second region is located between the first region and the third region, and a thickness of the second region is smaller than thicknesses of the first region and the third region;
   an insulating layer on the first region and the third region of the first electrode, edges of the insulating layer aligned with edges of the first region and the third region;
   a light emitting layer on and in contact with the second region of the first electrode and the insulating layer;
   a second electrode on the light emitting layer;
   a second substrate over the first substrate and the second electrode;
   a first sealing agent between the first substrate and the second substrate, a pattern shape of the first sealing agent having a quadrilateral shape along sides of the second substrate and having at least one opening;
   a second sealing agent between the first substrate and the second substrate, the second sealing agent being provided on the inside of the first sealing agent and covering the pixel portion; and
   a terminal portion over the first substrate, the terminal portion provided the outside of the first sealing agent and directly connected to a flexible printed circuit,
   wherein the opening of the first sealing agent is filled with the second sealing agent.

10. The display device according to claim 9,
    wherein each of the first region and the third region of the first electrode includes at least the first layer and the second layer, and
    wherein the second region of the first electrode includes the first layer.

11. The display device according to claim 9, wherein the first sealing agent includes a gap material maintaining a gap between the first substrate and the second substrate.

12. The display device according to claim 9, wherein the first sealing agent comprises an UV curable epoxy resin.

13. The display device according to claim 9, wherein the second sealing agent has a light transmitting property.

14. The display device according to claim 9, wherein the second sealing agent comprises a heat curable epoxy resin.

15. A display module comprising the display device according claim 9, further comprising a driver circuit portion inside the first sealing agent over the first substrate.

16. An electronic appliance including the display device according to claim 9, wherein the electronic appliance is selected from the group consisting of a video camera, a digital camera, a head mounted display, a goggle type display, a car navigation system, a projector, a car stereo, a personal computer, a portable information terminal, a mobile computer, a cellular phone, and an electronic book.

17. A display device comprising:
a first substrate having a pixel portion, the pixel portion comprising a transistor;
a first electrode including a first layer and a second layer over the first layer, the first electrode having a first region electrically connected to the transistor, a second region adjacent to the first region, and a third region adjacent to the second region, wherein the second region is located between the first region and the third region, and a thickness of the second region is smaller than thicknesses of the first region and the third region;
an insulating layer on the first region and the third region of the first electrode, edges of the insulating layer aligned with edges of the first region and the third region;
a light emitting layer on and in contact with the second region of the first electrode and the insulating layer;
a second electrode on the light emitting layer;
a second substrate over the first substrate and the second electrode;
a first sealing agent between the first substrate and the second substrate, a pattern shape of the first sealing agent having a quadrilateral shape along sides of the second substrate and having at least one opening; and
a second sealing agent between the first substrate and the second substrate, the second sealing agent being provided on the inside of the first sealing agent and covering the pixel portion,
wherein the edges of the first region and the third region have taper angles, and
wherein the opening of the first sealing agent is filled with the second sealing agent.

18. The display device according to claim 17, wherein the first layer comprises titanium and the second layer comprises aluminum.

19. The display device according to claim 17,
wherein each of the first region and the third region of the first electrode includes at least the first layer and the second layer, and
wherein the second region of the first electrode includes the first layer.

20. The display device according to claim 17, wherein the first sealing agent includes a gap material maintaining a gap between the first substrate and the second substrate.

21. The display device according to claim 17, wherein the first sealing agent comprises an UV curable epoxy resin.

22. The display device according to claim 17, wherein the second sealing agent comprises a heat curable epoxy resin.

23. A display module comprising the display device according claim 17, further comprising a driver circuit portion and a terminal portion over the first substrate.

24. An electronic appliance including the display device according claim 17, wherein the electronic appliance is selected from the group consisting of a video camera, a digital camera, a head mounted display, a goggle type display, a car navigation system, a projector, a car stereo, a personal computer, a portable information terminal, a mobile computer, a cellular phone, and an electronic book.

* * * * *